(12) United States Patent
Ando et al.

(10) Patent No.: US 8,940,599 B2
(45) Date of Patent: *Jan. 27, 2015

(54) SCALED EQUIVALENT OXIDE THICKNESS FOR FIELD EFFECT TRANSISTOR DEVICES

(71) Applicant: International Business Machines Corporation, Armonk, NY (US)

(72) Inventors: Takashi Ando, Tuckahoe, NY (US); Changhwan Choi, Seoul (KR); Unoh Kwon, Fishkill, NY (US); Vijay Narayanan, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/217,574

(22) Filed: Mar. 18, 2014

(65) Prior Publication Data

US 2014/0199828 A1 Jul. 17, 2014

Related U.S. Application Data

(60) Continuation of application No. 13/556,333, filed on Jul. 24, 2012, now Pat. No. 8,716,813, which is a division of application No. 12/788,454, filed on May 27, 2010, now Pat. No. 8,343,839.

(51) Int. Cl.
*H01L 21/8238* (2006.01)
*H01L 21/02* (2006.01)
(Continued)

(52) U.S. Cl.
CPC .. *H01L 21/823842* (2013.01); *H01L 21/02164* (2013.01); *H01L 21/02697* (2013.01); *H01L 21/823857* (2013.01); *H01L 21/28229* (2013.01); *H01L 29/517* (2013.01); *H01L 29/518* (2013.01)
USPC ............. 438/216; 436/283; 257/E21.635

(58) Field of Classification Search
CPC ............ H01L 21/02164; H01L 21/02697; H01L 21/823842; H01L 21/823857
USPC ................. 438/216, 283; 257/E21.635
See application file for complete search history.

(56) References Cited

U.S. PATENT DOCUMENTS 7,595,270 B2 9/2009 Elers et al.
7,829,953 B2 11/2010 Jung et al.
(Continued)

FOREIGN PATENT DOCUMENTS

JP 06340970 A 12/1994

OTHER PUBLICATIONS

Choi et al., "Extremely Scaled Gate-First High-k/Metal Gate Stack with EOT of 0.55nnn Using Novel Interfacial Layer Scavenging Techniques for 22nm Technology Node and Beyond," VLSI Tech. Dig., pp. 138-139, Jun. 2009.
(Continued)

*Primary Examiner* — Joseph C Nicely
(74) *Attorney, Agent, or Firm* — Cantor Colburn LLP; Vazken Alexanian

(57) ABSTRACT

A field effect transistor device includes a first gate stack portion including a dielectric layer disposed on a substrate, a first TiN layer disposed on the dielectric layer, a metallic layer disposed on the dielectric layer, and a second TiN layer disposed on the metallic layer, a first source region disposed adjacent to the first gate stack portion, and a first drain region disposed adjacent to the first gate stack portion.

12 Claims, 10 Drawing Sheets

(51) Int. Cl.
*H01L 21/28* (2006.01)
*H01L 29/51* (2006.01)

(56) References Cited

U.S. PATENT DOCUMENTS

| | | | |
|---|---|---|---|
| 7,947,549 B2* | 5/2011 | Park et al. | 438/216 |
| 7,964,918 B2 | 6/2011 | Kanegae et al. | |
| 2005/0081781 A1 | 4/2005 | Lin et al. | |
| 2005/0148127 A1 | 7/2005 | Jung et al. | |
| 2007/0048920 A1 | 3/2007 | Song et al. | |
| 2007/0178634 A1 | 8/2007 | Jung et al. | |
| 2008/0188044 A1* | 8/2008 | Hsu et al. | 438/211 |
| 2008/0203488 A1 | 8/2008 | Chung et al. | |
| 2008/0233764 A1 | 9/2008 | Takahashi et al. | |
| 2008/0290400 A1 | 11/2008 | Jenne et al. | |
| 2008/0303105 A1* | 12/2008 | Chang et al. | 257/412 |
| 2009/0008720 A1 | 1/2009 | Doris et al. | |
| 2009/0108294 A1 | 4/2009 | Choi et al. | |
| 2009/0108365 A1 | 4/2009 | Tseng et al. | |
| 2009/0108368 A1 | 4/2009 | Kanegae et al. | |
| 2009/0152636 A1* | 6/2009 | Chudzik et al. | 257/369 |
| 2009/0179282 A1 | 7/2009 | Doyle et al. | |
| 2009/0283838 A1 | 11/2009 | Park et al. | |
| 2010/0159678 A1 | 6/2010 | Nayfeh et al. | |
| 2010/0187610 A1 | 7/2010 | Kwon et al. | |
| 2010/0187612 A1 | 7/2010 | Ikeno et al. | |
| 2010/0320547 A1 | 12/2010 | Ando et al. | |
| 2011/0036288 A1 | 2/2011 | Kawano et al. | |
| 2011/0108924 A1 | 5/2011 | Suzuki et al. | |
| 2011/0115027 A1 | 5/2011 | Jagannathan et al. | |
| 2011/0300719 A1 | 12/2011 | Harada et al. | |
| 2013/0005156 A1 | 1/2013 | Jagannathan et al. | |
| 2013/0193523 A1 | 8/2013 | Wang et al. | |

OTHER PUBLICATIONS

Park, Jin et al, "Comparison of TiN and TiN/Ti/TiN Multilayer Films for Diffusion Barrier Applications", Journal of the Korean Physical Society, vol. 42, No. 6, Jun. 2003, pp. 817-820.

* cited by examiner

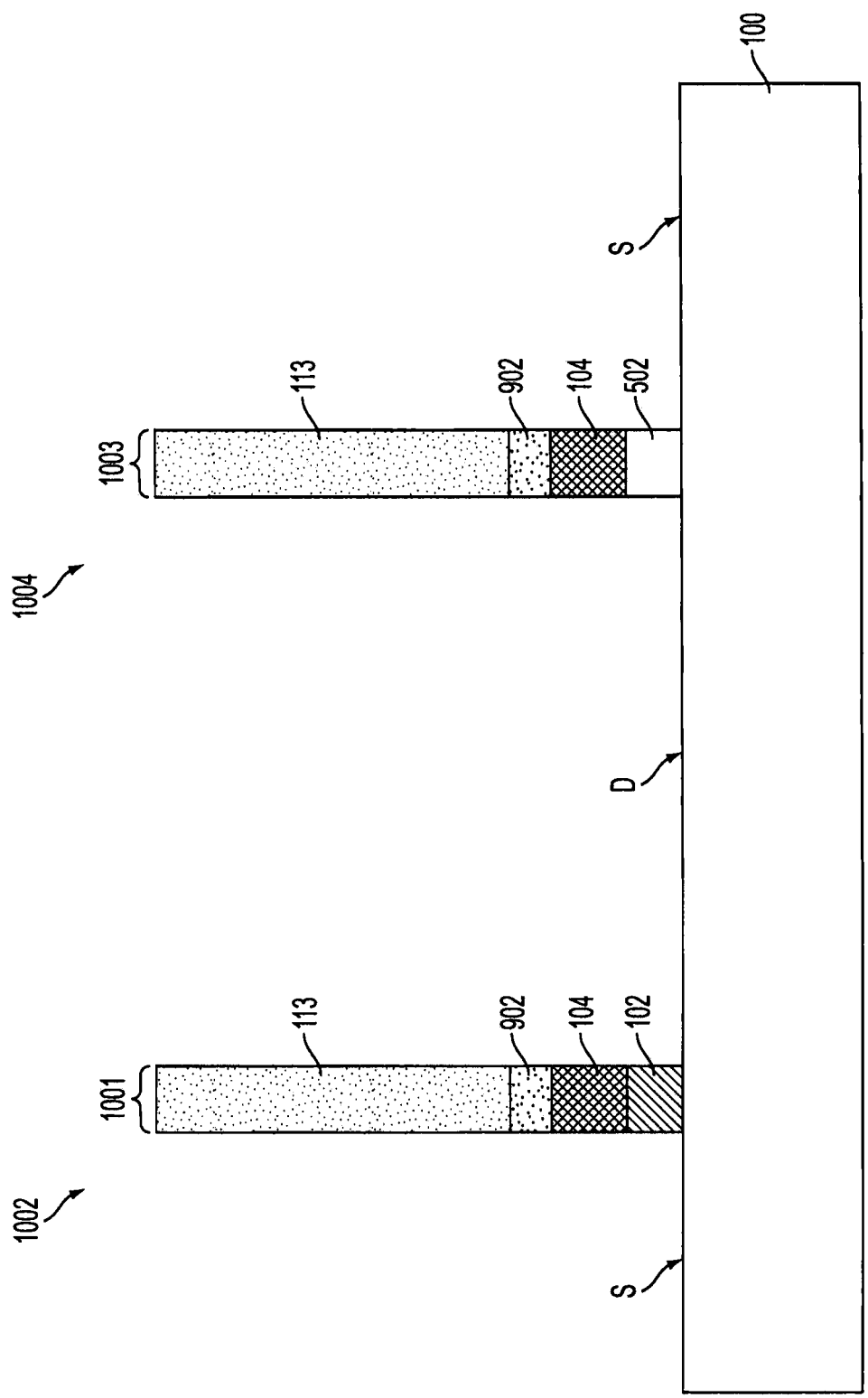

SCALED EQUIVALENT OXIDE THICKNESS FOR FIELD EFFECT TRANSISTOR DEVICES

CROSS-REFERENCE TO RELATED APPLICATIONS

This application is a continuation of U.S. patent application Ser. No. 13/556,333, filed Jul. 24, 2012, which is a divisional application of application Ser. No. 12/788,454, filed May 27, 2010, now U.S. Pat. No. 8,343,839, the disclosure of which is incorporated by reference herein in its entirety.

FIELD OF INVENTION

The present invention relates to semiconductor field effect transistors and to equivalent oxide thicknesses in field effect transistor devices.

DESCRIPTION OF RELATED ART

Field effect transistor (FET) devices such as, for example, pFET and nFET devices often include an oxide layer or interfacial layer (IL) disposed between a substrate and the high-k layer or metal gate layer of the devices. The IL layer determines the equivalent oxide thickness (EOT) of the device. It may be desirable to reduce the EOT in some devices to improve the scalability and performance of the devices.

BRIEF SUMMARY

According to one embodiment of the present invention, a method for forming a field effect transistor device includes forming an oxide layer on a substrate, forming a dielectric layer on the oxide layer, forming a first TiN layer on the dielectric layer, forming a metallic layer on the first layer, forming a second TiN layer on the metallic layer, removing a portion of the first TiN layer, the metallic layer, and the second TiN layer to expose a portion of the dielectric layer, forming a layer of stoichiomectric TiN on the exposed portion of the dielectric layer and the second TiN layer, heating the device, and forming a polysilicon layer on the device.

According to another embodiment of the present invention a field effect transistor device includes a first gate stack portion including a dielectric layer disposed on a substrate, a first TiN layer disposed on the dielectric layer, a metallic layer disposed on the dielectric layer, and a second TiN layer disposed on the metallic layer, and a first source region disposed adjacent to the first gate stack portion, and a first drain region disposed adjacent to the first gate stack portion.

According to yet another embodiment of the present invention a field effect transistor device includes a first gate stack portion including, a dielectric layer disposed on a substrate, and a polysilicon layer disposed on, a first source region disposed adjacent to the first gate stack portion, and a first drain region disposed adjacent to the first gate stack portion, a second gate stack portion including, an oxide layer disposed on the substrate, a dielectric layer disposed on the oxide layer, a stoichiometric TiN layer disposed on the dielectric layer, and a polysilicon layer disposed on the stoichiometric TiN layer, a second source region disposed adjacent to the second gate stack portion, and a second drain region disposed adjacent to the second gate stack portion.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 8-10 illustrate side views of an alternate exemplary method for forming FET devices.

DETAILED DESCRIPTION

In some devices, such as, for example, pFET devices, it may be desirable to reduce the EOT of the device. Since the thickness of the interfacial layer of pFET devices affects the EOT of the devices, reducing the thickness of—or removing—the interfacial layer may desirably reduce the EOT of such devices. The figures described below illustrate methods for forming pFET and nFET devices with reduced interfacial layer thicknesses, and the resultant devices.

Figure 1:
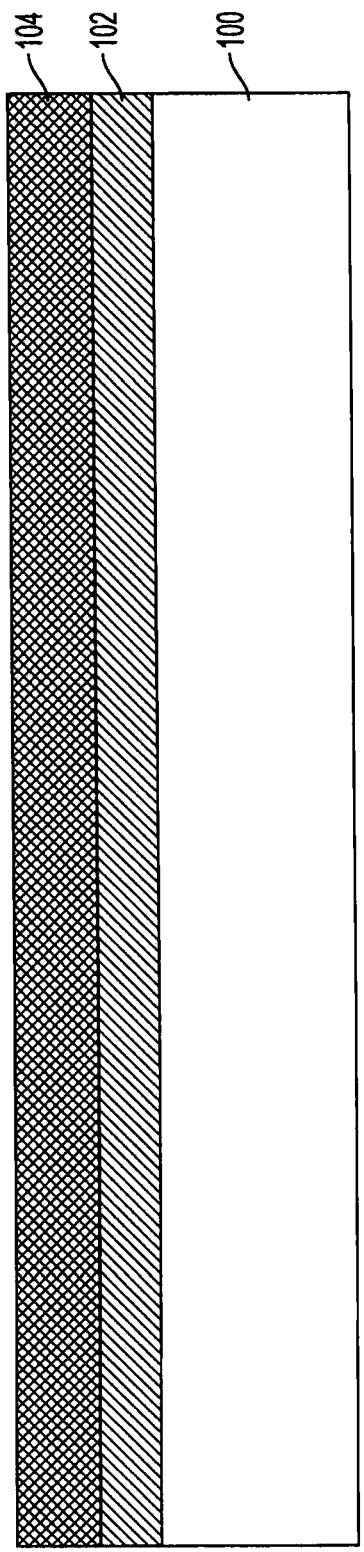
FIGS. 1-7 illustrate side views of an exemplary method for forming field effect transistor (FET) devices.

FIGS. 1-7 illustrate side views of an exemplary method for forming field effect transistor (FET) devices. Referring to FIG. 1, an interfacial layer (IL) 102 is formed on a substrate 100. The substrate 100 may include, for example, Si or a SiGe and Si material. The IL 102 includes an oxide material such as, for example, $SiO_2$. A gate dielectric layer 104 such as, for example a high-K layer (e.g., $HfO_2$, $ZrO_2$, $HfSiO_4$, $ZrSiO_4$) is disposed on the IL 102.

Figure 2:
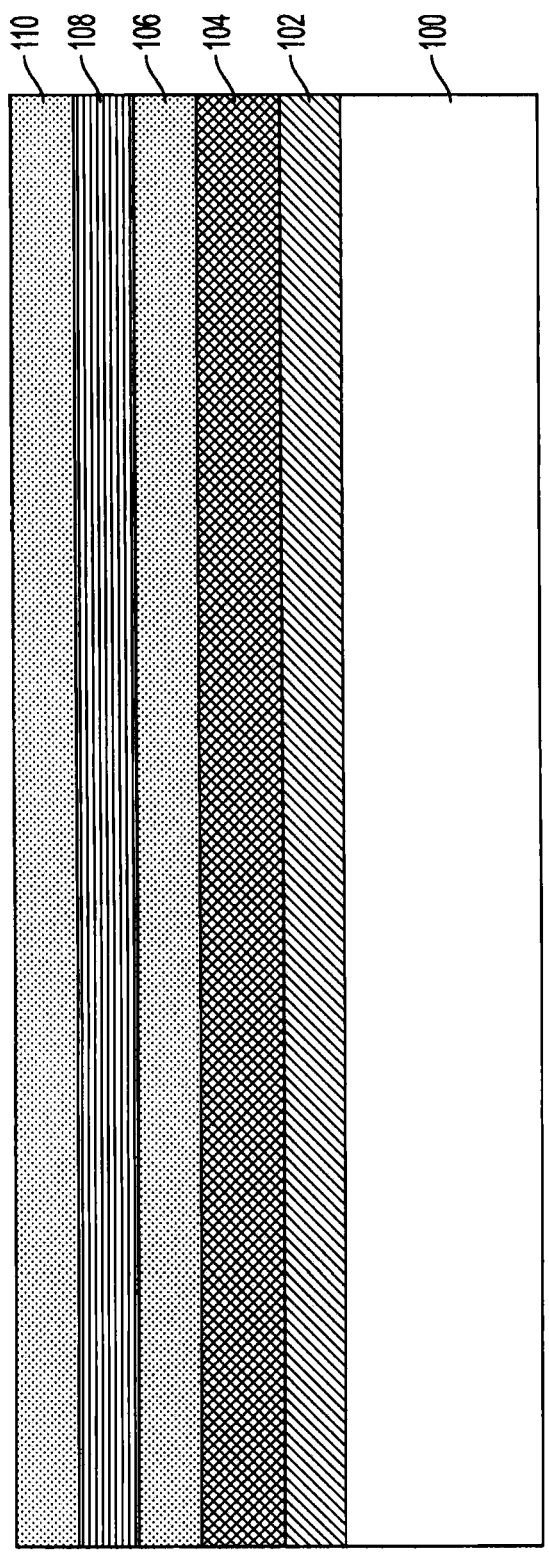

FIG. 2 illustrates the resultant structure following the formation of a Ti-rich layer of TiN (first TiN layer) 106 on the high-K layer 104, a metallic layer 108, such as, for example Al on the high-K layer 104, and a second Ti-rich layer of TiN (second TiN layer) 110 on the metallic layer 108. Ti-rich TiN includes TiN with a Ti/(Ti+N) ratio greater than 0.5. The metallic layer includes a metal (M) for which the Gibbs free energy change of the reaction, $Si + 2/y\, M_xO_y \rightarrow 2x/y\, M + SiO_2$, is positive. Examples include, but are not limited to, Al, Be, Mg, Ca, Sr, Ba, Sc, Y, La, Ti, Zr, Hf, Dy, Lu, Er, Pr, and Ce.

Figure 3:
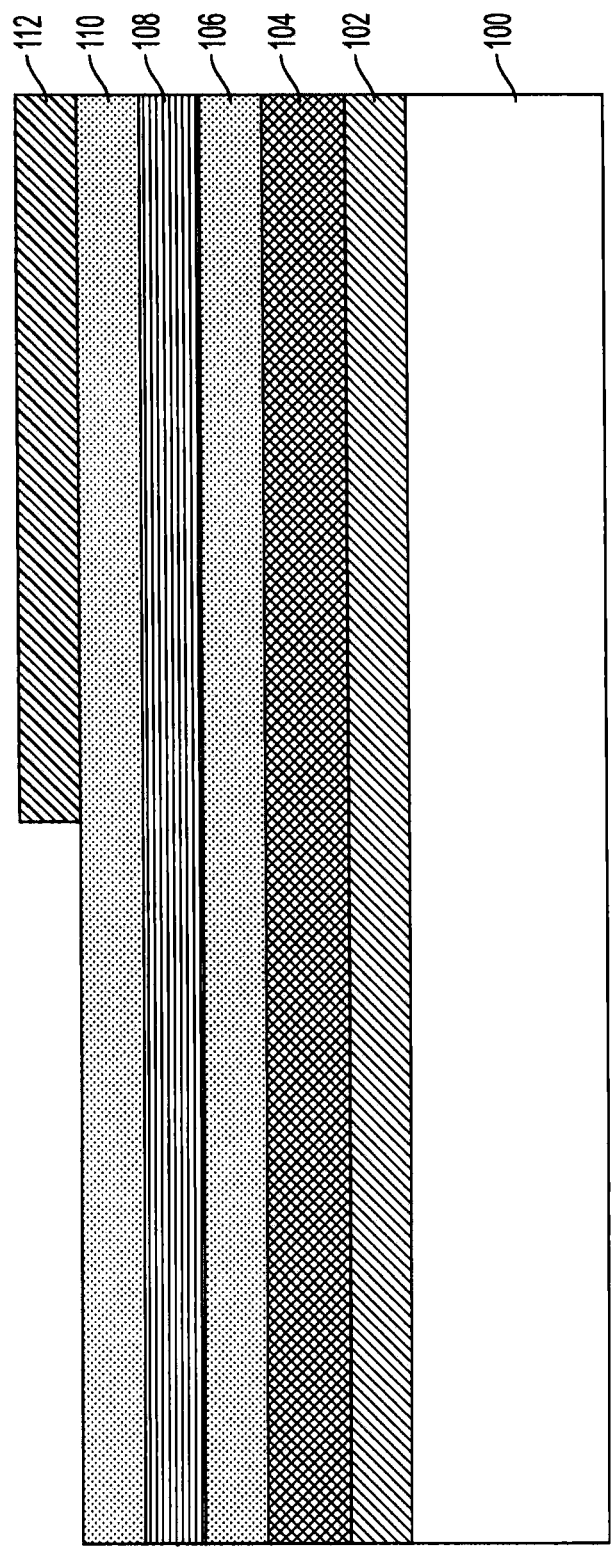

FIG. 3 illustrates the resultant structure following the patterning of a masking layer 112 on a portion of second TiN layer 110. The masking layer 112 may include for example, a lithographically patterned photoresist layer or a patterned hardmask layer such as a nitride or oxide material.

Figure 4:
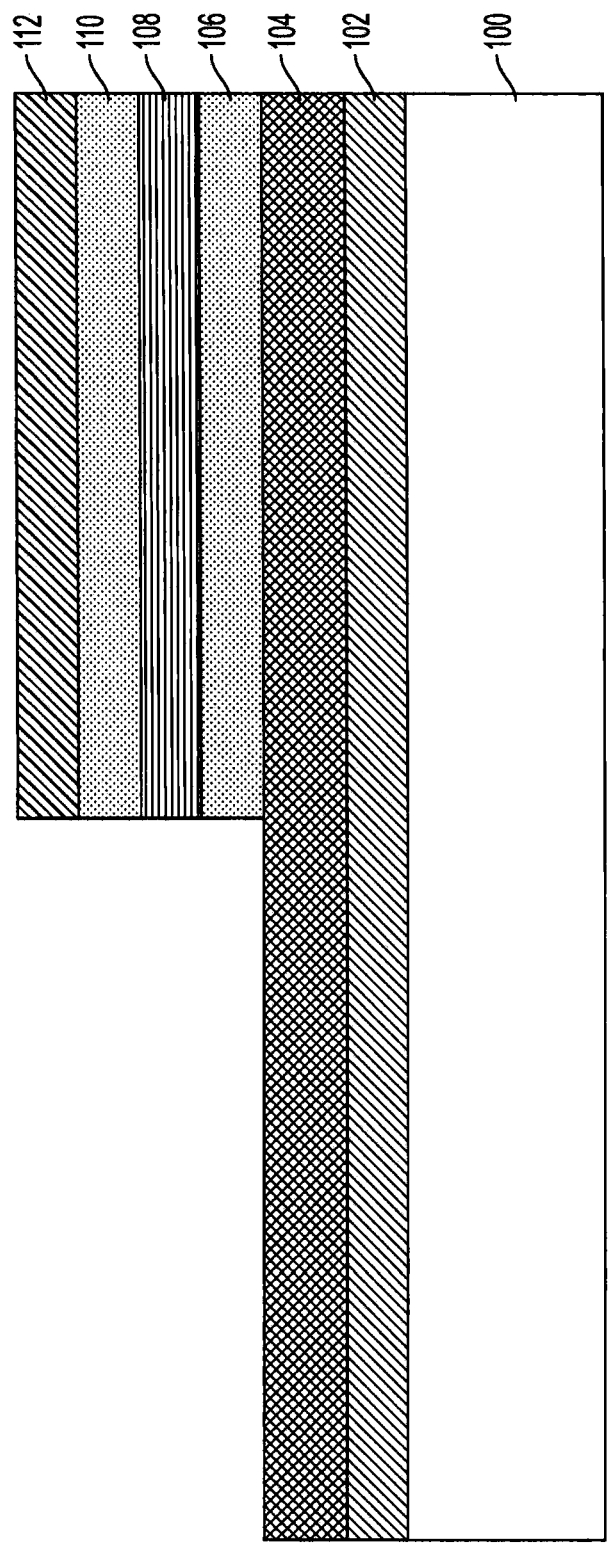

FIG. 4 illustrates the resultant structure following an etching process, such as, for example a wet etching or other suitable etching process that removes exposed portions of the first TiN layer 106, the metallic layer 108 and the second TiN layer 110, exposing a portion of the high-K layer 104.

Figure 5:
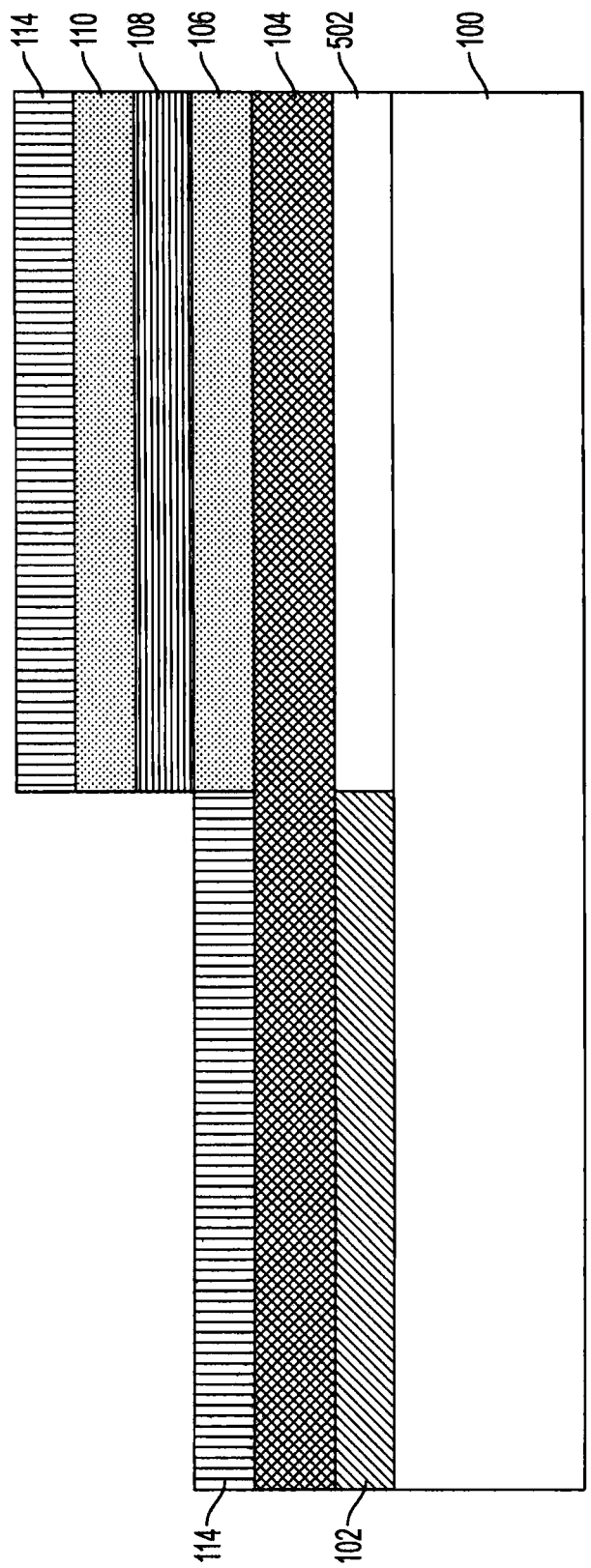

FIG. 5 illustrates the resultant structure following the removal of the masking layer 112 and the formation of a stoichiometric TiN layer 114 on the exposed high-K layer 104 and the second TiN layer 110. The stoichiometric TiN has a Ti/(Ti+N) ratio of 0.5, which may be deposited by, for example, reactive physical vapor deposition with an optimized $N_2$ flow or by an atomic layer deposition method. Once the stoichiometric TiN layer 114 is formed, the device is annealed at temperatures between, for example, 400° C. to 600° C. The annealing affects a portion of the IL 102 resulting in the removal of $O_2$ from the $SiO_2$ in the region 502 (below the TiN layer 106, the metallic layer 108 and the second TiN layer 110), while maintaining the same thickness of $SiO_2$ in the IL 102 region. The removal of the $O_2$ in the region 502 results in the region 502 having less $SiO_2$ and more Si than the adjacent IL 102 layer, reducing the EOT of devices that include the region 502.

Figure 6:
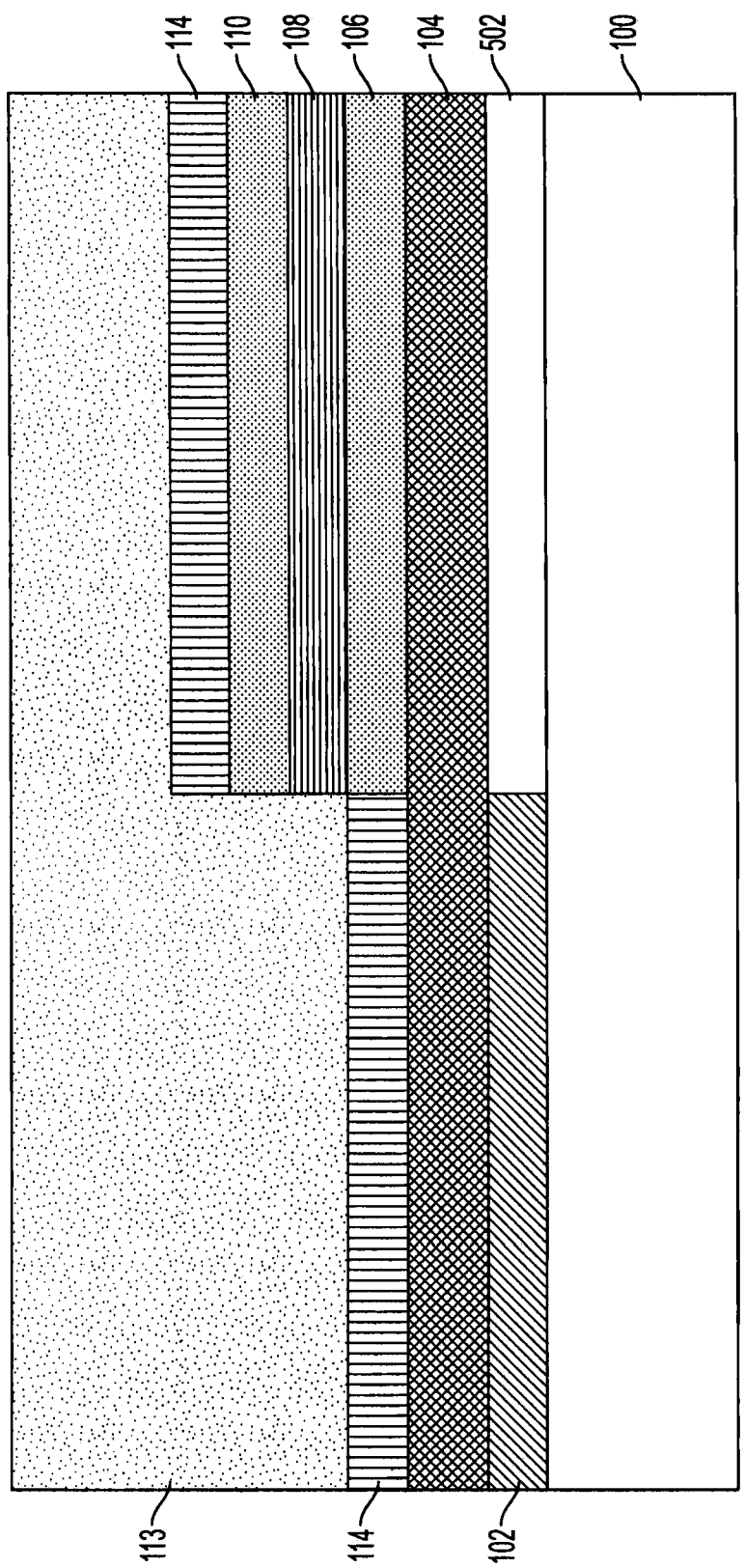

FIG. 6 illustrates the formation of a capping layer 113, such as, for example, polysilicon that is formed on the stoichiometric TiN layer 114.

Figure 7:
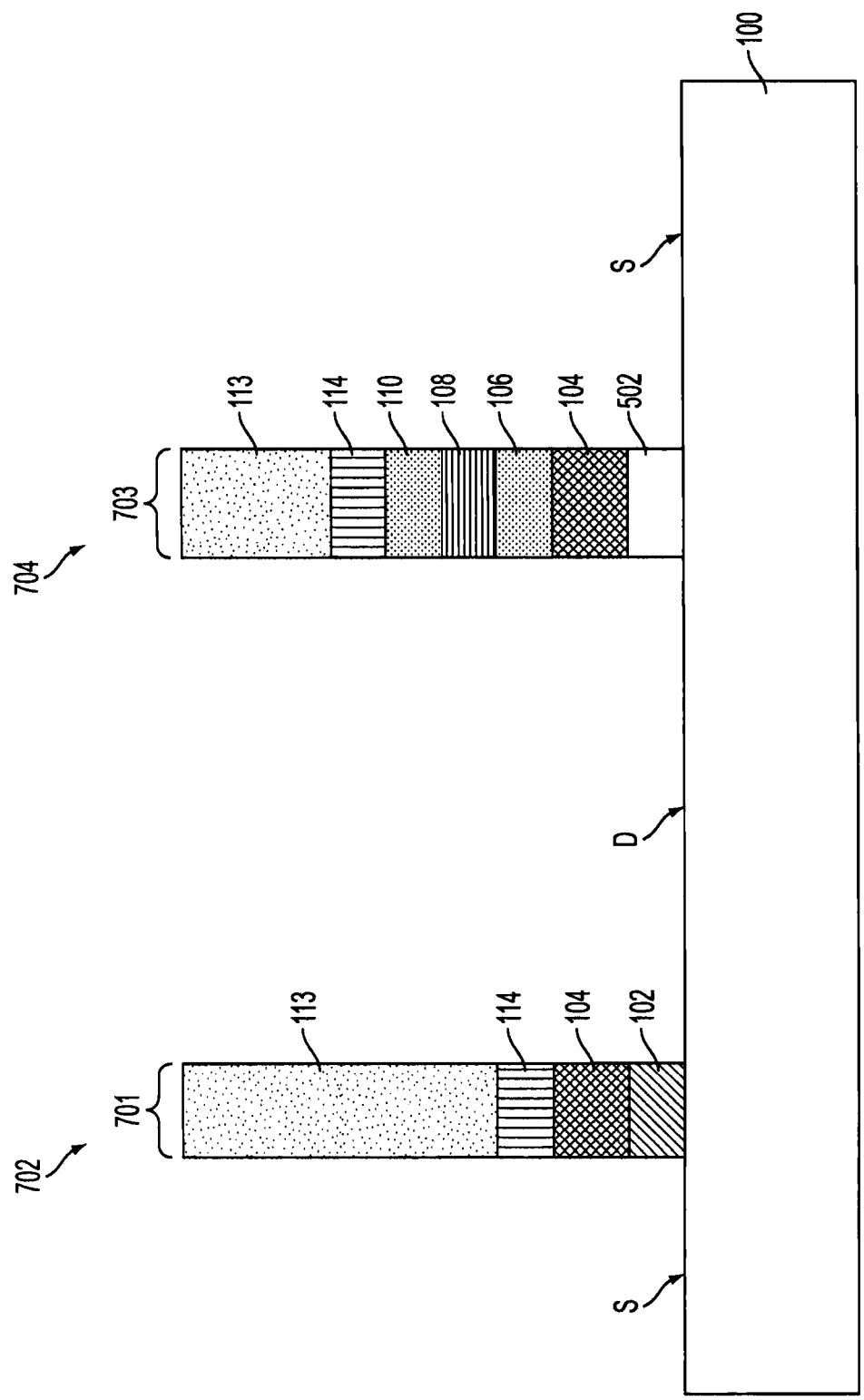

FIG. 7 illustrates the resultant structure following the patterning and formation of gate stack 701, gate stack 703, and source (S) and drain (D) regions. In the illustrated embodiment, the gate stack 701 is a portion of an nFET device 702, and the gate stack 703 is a portion of a pFET device 704. Following the patterning of the gate stacks 701 and 703 and the formation of the source and drain regions, conductive contacts (not shown) may be formed contacting the gate stacks 701, 703, and the source and drain regions. The formation of the region 502 reduces the thickness of (or removes) the interfacial layer of the pFET device 704 and desirably reduces the EOT of the pFET device 704. Though the illustrated embodiment forms the region 502 in gate stack 703 of the pFET device 704, the region 502 may be formed in a similar manner for an nFET device resulting in a reduced EOT of an nFET device if desired.

Figure 8:
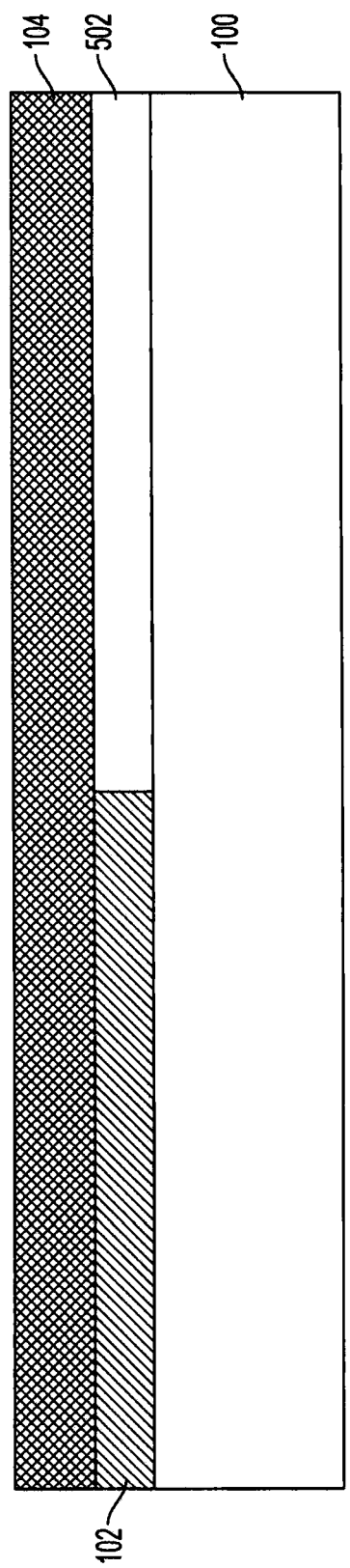
Figure 9:
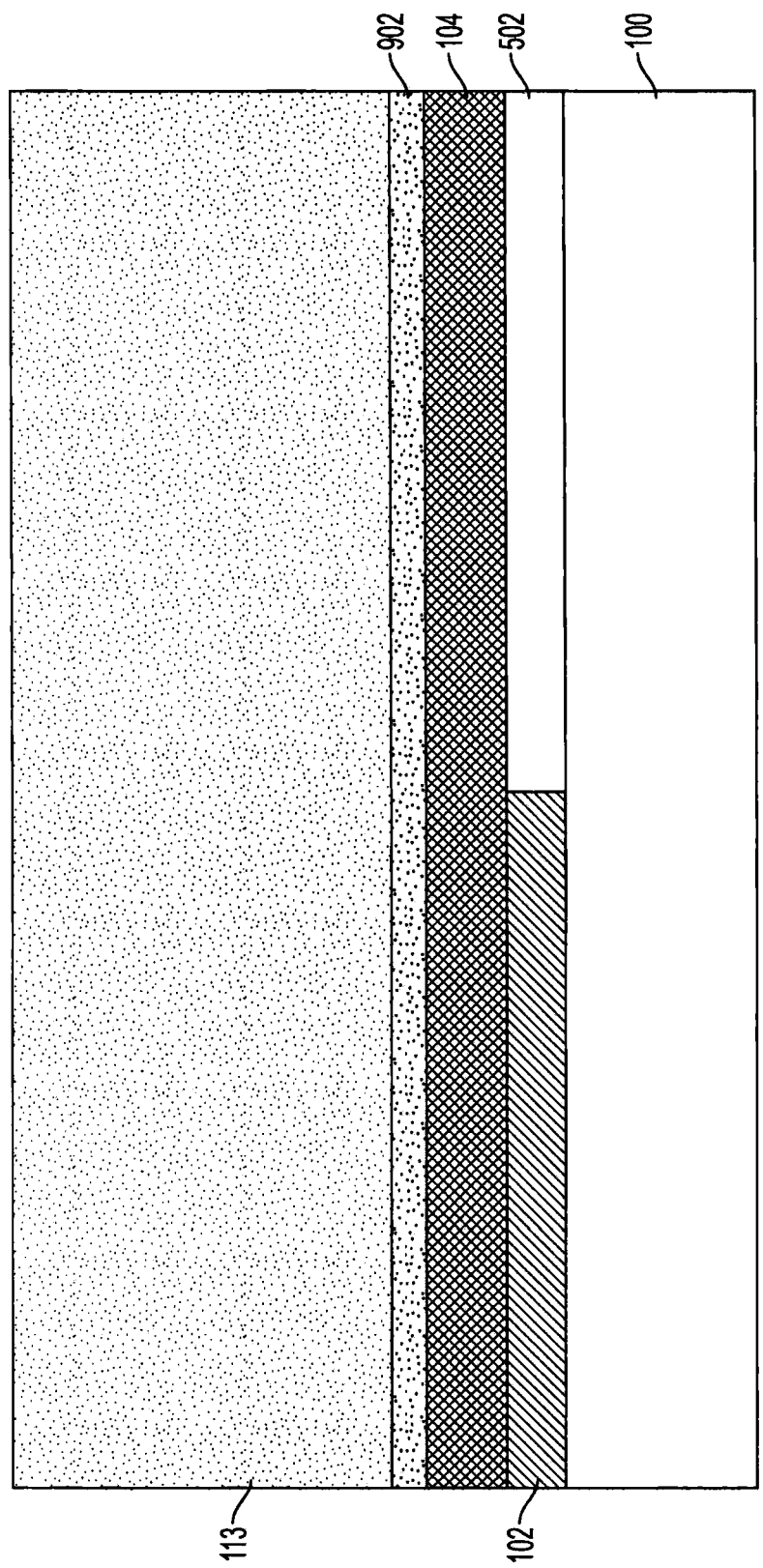

FIGS. 8-10 illustrate side views of an alternate exemplary method for forming FET devices. In this regard, the exemplary method is similar to the methods described above in FIGS. 1-5. Referring to FIG. 8, once the region 502 is formed as in FIG. 5 above, the first TiN layer 106, the metallic layer 108 and the second TiN layer 110, and the stoichiometric TiN layer 114 are removed, exposing the high-K layer 104.

FIG. 9 illustrates the resultant structure following the formation of a thin stoichiometric TiN layer 902 on the high-K layer 104 and a capping layer 113 on the TiN layer 902. The capping layer 113 is formed in a similar manner as described above.

FIG. 10 illustrates the resultant structure following the patterning and formation of gate stack 1001, gate stack 1003, and source (S) and drain (D) regions. In the illustrated embodiment, the gate stack 1001 is a portion of an nFET device 1002, and the gate stack 1003 is a portion of a pFET device 1004. Following the patterning of the gate stacks 1001 and 1003 and the formation of the source and drain regions, conductive contacts (not shown) may be formed contacting the gate stacks 1001, 1003, and the source and drain regions. Though the illustrated embodiment forms the region 502 in gate stack 1003 of the pFET device 1004, the region 502 may be formed in a similar manner for an nFET device.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of forming field effect transistor (FET) device, the method comprising:
   forming a first gate stack portion and a second gate stack portion on a substrate;
   the first gate stack portion further comprising a first interfacial (IL) layer formed on the substrate, a dielectric layer formed on the first IL layer, a stoichiometric TiN layer formed over the dielectric layer, and a capping layer formed over the stoichiometric TiN layer; and
   the second gate stack portion further comprising a second IL layer formed on the substrate, the dielectric layer formed on the second IL layer, the stoichiometric TiN layer formed over the dielectric layer, and the capping layer formed over the stoichiometric TiN layer, wherein forming the second gate stack portion further comprises:
      forming a first Ti-rich TiN layer on the dielectric layer;
      forming a metallic layer on the first Ti-rich TiN layer;
      forming a second Ti-rich TiN layer on the metallic layer; and
      forming the stoichiometric TiN layer on the second Ti-rich TiN layer;
   wherein the second IL layer has a reduced oxygen content and an increased silicon content with respect to the first IL layer such that an equivalent oxide thickness (EOT) of the second gate stack portion is reduced with respect to the first gate stack portion.

2. The method of claim 1, wherein the dielectric layer is a high-K material.

3. The method of claim 1, wherein:
   the stoichiometric TiN layer has a Ti/(Ti+N) ratio of 0.5; and
   the first and second Ti-rich TiN layers have a Ti/(Ti+N) ratio greater than 0.5.

4. The method of claim 3, wherein the metallic layer comprises a metal (M) for which the Gibbs free energy change of the reaction, $Si+2/y\ M_xO_y \rightarrow 2x/y\ M+SiO_2$, is positive.

5. The method of claim 4, wherein the metallic layer comprises one or more of: Al, Be, Mg, Ca, Sr, Ba, Sc, Y, La, Ti, Zr, Hf, Dy, Lu, Er, Pr, and Ce.

6. The method of claim 1, wherein the first gate stack portion comprises an nFET gate stack and the second gate stack portion comprises a pFET gate stack.

7. A method of forming a field effect transistor (FET) device, the method comprising:

forming a first gate stack portion and a second gate stack portion on a substrate;

the first gate stack portion further comprising a first $SiO_2$ interfacial (IL) layer formed on the substrate, a dielectric layer formed on the first $SiO_2$ IL layer, a stoichiometric TiN layer formed over the dielectric layer, and a capping layer formed over the stoichiometric TiN layer; and the second gate stack portion further comprising a second $SiO_2$ IL layer formed on the substrate, the dielectric layer formed on the second $SiO_2$ IL layer, the stoichiometric TiN layer formed over the dielectric layer, and the capping layer formed over the stoichiometric TiN layer, wherein forming the second gate stack portion further comprises:

forming a first Ti-rich TiN layer formed on the dielectric layer;
  forming a metallic layer on the first Ti-rich TiN layer;
  forming a second Ti-rich TiN layer on the metallic layer; and
  forming the stoichiometric TiN layer on the second Ti-rich TiN layer;

forming a drain region disposed between the first gate stack portion and the second gate stack portion;

forming a first source region disposed adjacent to the second gate stack portion; and forming a second source region disposed adjacent to the second gate stack portion;

wherein the second $SiO_2$ IL layer has a reduced oxygen content and an increased silicon content with respect to the first $SiO_2$ IL layer due to removal of $O_2$ therefrom such that an equivalent oxide thickness (EOT) of the second gate stack portion is reduced with respect to the first gate stack portion.

8. The method of claim 7, wherein the dielectric layer is a high-K material.

9. The device of claim 7, wherein:

the stoichiometric TiN layer has a Ti/(Ti+N) ratio of 0.5; and the first and second Ti-rich TiN layers have a Ti/(Ti+N) ratio greater than 0.5.

10. The method of claim 9, wherein the metallic layer comprises a metal (M) for which the Gibbs free energy change of the reaction, $Si+2/y\, M_xO_y \rightarrow 2x/y\, M+SiO_2$, is positive.

11. The method of claim 10, wherein the metallic layer comprises one or more of: Al, Be, Mg, Ca, Sr, Ba, Sc, Y, La, Ti, Zr, Hf, Dy, Lu, Er, Pr, and Ce.

12. The method of claim 7, wherein the first gate stack portion comprises an nFET gate stack and the second gate stack portion comprises a pFET gate stack.

* * * * *